(12) United States Patent
Sekiguchi et al.

(10) Patent No.: US 6,562,222 B1
(45) Date of Patent: May 13, 2003

(54) COPPER ELECTROPLATING LIQUID, PRETREATMENT LIQUID FOR COPPER ELECTROPLATING AND METHOD OF COPPER ELECTROPLATING

(75) Inventors: Jyunnosuke Sekiguchi, Ibaraki (JP); Syunichiro Yamaguchi, Ibaraki (JP)

(73) Assignee: Nikko Materials Company, Limited, Tokyo (JP)

( * ) Notice: Subject to any disclaimer, the term of this patent is extended or adjusted under 35 U.S.C. 154(b) by 0 days.

(21) Appl. No.: 09/980,947

(22) PCT Filed: Jun. 26, 2000

(86) PCT No.: PCT/JP00/03394

§ 371 (c)(1),
(2), (4) Date: Dec. 5, 2001

(87) PCT Pub. No.: WO01/53569

PCT Pub. Date: Jul. 26, 2001

(30) Foreign Application Priority Data

Jan. 20, 2000 (JP) ........................................ 2000-011620
Feb. 21, 2000 (JP) ........................................ 2000-042158

(51) Int. Cl.[7] .............................. C25D 3/38; C25D 5/34
(52) U.S. Cl. ........................ 205/296; 205/297; 205/291; 205/210
(58) Field of Search ................................. 205/296, 297, 205/298, 291

(56) References Cited

U.S. PATENT DOCUMENTS

| | | | |
|---|---|---|---|
| 4,376,685 A | 3/1983 | Watson ...................... | 204/52 R |
| 5,616,230 A | 4/1997 | Otsuka et al. .............. | 205/125 |
| 6,270,889 B1 * | 8/2001 | Kataoka et al. ............. | 428/352 |
| 6,444,110 B2 * | 9/2002 | Barstad et al. .............. | 205/123 |

FOREIGN PATENT DOCUMENTS

JP 41-20805 B1 * 12/1966
JP 06-330378 A * 11/1994

OTHER PUBLICATIONS

References N and O were cited on the International Search Report.*
esp@cenet—Document Bibliography and Abstract for JP 08–31834 A of Nippon Denso Co., Feb. 1996.
Derwent Patent Abstract for JP 2678701 B2 of Ishihara Yakuhin, Aug. 1997.
Derwent Patent Abstract for JP 51–21529 A of Hitachi Ltd., Feb. 1976.
Derwent Patent Abstract for JP 50–104143 A of Okuno, Aug. 1975.
esp@cenet—Document Bibliography and Abstract for JP 08–039728 A of Sumitomo Metal Mining, Feb. 1996.
esp@cenet—Document Bibliography and Abstract for JP 11–256349 A of Honma et al., Sep. 1999.
esp@cenet –Document Bibliography and Abstract for JP 09–078251 A of Hitachi Chem Co., Mar. 1997.
esp@cenet –Document Bibliography and Abstract for JP 07–157890 A of Okuno Chem Ind. Co., Jun. 1995.
Derwent Patent Abstract for JP 06–074514 A of Asahi Chem. Ind. Co., Sep. 1994.

* cited by examiner

*Primary Examiner*—Edna Wong
(74) *Attorney, Agent, or Firm*—Howson and Howson

(57) ABSTRACT

In filling fine via holes or trenches of the wiring (LSI) pattern formed on a semiconductor wafer, a copper electroplating is carried out by using a copper electroplating solution. containing an azole or a silane coupling agent, or a copper electroplating is carried out after the immersion into a pretreatment solution containing an azole or a silane coupling agent. As illustratively shown above, the addition of a component having the action to inhibit the dissolution of copper to an electroplating solution or the pretreatment by a solution containing a component having the action to inhibit the dissolution of copper can inhibit the dissolution of a copper seed layer covering poorly, and thus can prevent the occurrence of defects such as voids and seams.

17 Claims, No Drawings

COPPER ELECTROPLATING LIQUID, PRETREATMENT LIQUID FOR COPPER ELECTROPLATING AND METHOD OF COPPER ELECTROPLATING

FIELD OF THE INVENTION

The present invention relates to a copper electroplating solution for forming copper wiring on a semiconductor wafer, and more specifically to a copper electroplating solution, a pretreatment liquid for copper electroplating, and a method of copper electroplating suitable for filling fine via holes or trenches formed on a semiconductor wafer without producing defects such as voids or seams.

BACKGROUND OF THE INVENTION

In processing semiconductor wafers, aluminum has chiefly been used as a wiring material; however, as the density of wirings integration increases, copper, which has higher electric conductivity, has substituted aluminum to prevent increase in the delay time of signals.

For the formation of copper wirings, the Damascene method is used, in which after forming a wiring pattern on a silicon wafer, a barrier layer and a seed layer are formed using a CVD method or a sputtering method, then the wiring pattern is filled using electroplating, and excessively deposited copper is removed using CMP (chemical-mechanical polishing).

In order to form a copper wiring on the semiconductor wafer, as described above, it is required to fill via holes or trenches. In recent times, however, since the wiring patterns have become finer, the coverage of the copper seed layers in via holes or trenches formed using sputtering or the like have become poor, and the portions where the copper films is extremely thin are often produced.

Although an electroplating solution based on an aqueous solution containing copper sulfate acidified with sulfuric acid has generally been used for the above-described copper electroplating, the use of such an electroplating solution acidified with sulfuric acid has caused a phenomenon of easy dissolution of copper seed layers by the sulfuric acid contained in the electroplating solution.

Therefore, there have been problems that copper is not deposited, and defects such as voids and seams occur inevitably on the area lacking the seed layer due to this dissolution.

Heretofore, copper electroplating solutions and methods of electroplating, which enable the filling without copper seed layer dissolution, have not existed, and the method for solving the problems has been sought.

OBJECTS OF THE INVENTION

The object of the present invention is to develop a copper electroplating solution and a method of electroplating for filling fine via holes or trenches of a wiring (LSI) pattern formed on a semiconductor wafer. This is accomplished by adding a copper dissolution inhibiting component in the electroplating solution or by pretreatment using a solution that contains a copper dissolution inhibiting component to inhibit the dissolution of the cooper seed layer of poor coverage and to prevent producing defects such as voids or seams.

SUMMARY OF THE INVENTION

In view of the above-described problems, the present invention provides a copper electroplating solution containing an azole or silane coupling agent, such as, 1 to 10000 mg/L, or 10 to 5000 mg/L, of the azole or silane coupling agent. The copper electroplating solution can be a copper sulfate electroplating solution containing copper sulfate, sulfuric acid, chlorine, and additives as major components. The present invention also provides a pretreatment solution for copper electroplating containing an azole or silane coupling agent, such as, 1 to 10000 mg/L, or 10 to 5000 mg/L, of the azole or silane coupling agent.

The present invention also provides a method of copper electroplating including immersion in a copper sulfate electroplating solution containing the azole or silane coupling agent and, as major components, copper sulfate, sulfuric acid, chlorine, and additives for 1 to 60 seconds, or for 3 to 10 seconds. The copper electroplating solution contains 1 to 10000 mg/L, or 10 to 5000 mg/L, of the azole or silane coupling agent. The electroplating can also be carried out using a copper sulfate electroplating solution containing copper sulfate, sulfuric acid, chlorine, and additives as major components after the step of immersion in an aqueous solution containing an azole or silane coupling agent, for instance, for 1 to 60 seconds, or for 3 to 10 seconds. The aqueous solution can contain 1 to 10000 mg/L, or 10 to 5000 mg/L, of the azole or silane coupling agent.

DETAILED DESCRIPTION OF THE PREFERRED EMBODIMENTS

A via hole or a trench for filling copper wiring is formed on the surface of a semiconductor (such as silicon) wafer, and is covered with a barrier metal selected from a group consisting of titanium (Ti), tantalum (Ta), tungsten (W), the nitrides thereof, and the like, of a thickness of about 0.01 to 0.1 μm, for preventing the diffusion of copper (Cu) into silicon (Si) on the surface by a covering method such as vapor deposition sputtering and CVD method or the like.

On the barrier metal layer is deposited a thin copper layer (seed layer) using a covering method such as vapor deposition, sputtering, and CVD, similarly to the above.

Since the above-described barrier metal has generally a high electric resistance, and in subsequent copper electroplating to be covered, difference in current densities between the vicinity of the contact provided in the circumferential portion of the wafer and the central portion becomes large, copper, which has a low electric resistance, is previously applied (thin coating).

The thickness of the copper layer is 0.01 to 0.1 μm. However, the thickness of the copper layer may be determined optionally in semiconductor processing, and is not limited to the above-described range.

In general, the copper wiring (LSI etc.) is formed by using a process, in which after forming a wiring pattern on a silicon wafer using the Damascene method, a barrier layer and a seed layer (a thin copper layer) are formed using a CVD method or a sputtering method, then the wiring pattern is filled using electroplating, and excessively deposited copper is removed using CMP (chemical-mechanical polishing).

The present invention uses a copper electroplating solution containing an azole or silane coupling agent, in place of conventional copper electroplating methods for filling.

The addition of an azole or silane coupling agent to the copper electroplating solution is a significant feature of the present invention, and effectively inhibits the dissolution of the seed layer formed by sputtering.

As a result, the problems of the occurrence of defects such as voids and seams in conventional copper electroplating methods for filling can be solved at a stroke.

The azole added to the above-described electroplating solution is the general term for heterocyclic compounds with five atoms having two or more different atoms, among which at least one is a nitrogen atom.

The representative example of the azoles include imidazole, thiazole, 1,2,3-triazole, 1,2,3-thiazole, 1,2,3,4-tetrazole, 1,2,3,4-thiatriazole, bendazole, benzimidazole, 1,2,3-benzotriazole, and 5-methyl-1-H-benzotriazole.

These azoles have an excellent effect in that they form a complex compound with copper by the lone election pair of nitrogen atoms to form a durable film on the surface of copper, which inhibits dissolution by an acid.

Also, the silane coupling agent is an organo-silicic compound (silane) having the action to chemically bond an organic material with an inorganic material (coupling), and has an organic functional group (X) having affinity (or reactivity) with the organic material and a hydrolyzing group (OR) having affinity (or reactivity) with the inorganic material. The chemical structure thereof is represented by a general formula, $XSi(OR)_3$.

The representative example of the silane coupling agents includes imidazole silane as indicated by the following general formulas (1), (2), and (3).

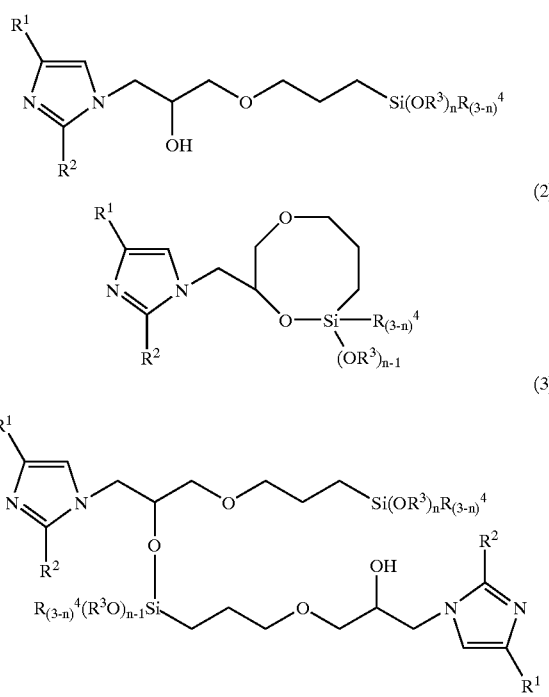

(where $R^1$ denotes a hydrogen atom, a vinyl group, or an alkyl group having 1 to 5 carbon atoms; $R^2$ denotes a hydrogen atom, or an alkyl group having 1 to 20 carbon atoms; each of $R^3$ and $R^4$ denotes an alkyl group having 1 to 3 carbon atoms; and n denotes an integer from 1 to 3.); aminosilanes (e.g., γ-aminopropyltrimethoxysilane, γ-aminopropyltriethoxysilane, N-β-(aminoethyl)-γ-aminopropyltrimethoxysilane, and N-β-(aminoethyl)-γ-aminopropyltriethoxysilane); epoxysilanes (e.g., γ-glycidoxypropyltrimethoxysilane, γ-glycidoxypropylmethyldiethoxysilane, and γ-glycidoxypropyltriethoxysilane); vinylsilanes (e.g., vinyltrichlorosilane, vinyltrimethoxysilane, and vinyltriethoxysilane); methacrylsilanes (e.g., γ-methacryloxypropylmethyldimethoxy silane, γ-methacryloxypropyltrimethoxysilane, γ-methacryloxypropylmethyldiethoxysilane, and γ-methacryloxypropyltriethoxysilane); and mercaptosilanes (e.g., γ-mercaptopropyltrimethoxysilane), Alkoxysilyl (Si—OR) groups in these silane coupling agents are hydrolyzed by water or moisture to form silanol groups, which react with the surface of copper to form SiO—Cu bonds.

Furthermore, remaining silanol groups, which have not bonded with copper, are hydrolyzed to form siloxane bonds with each other, resulting in the formation of a film on the surface of copper. This film has an excellent effect to protect copper from dissolution due to an acid.

The quantity of the azole or silane coupling agent added to the copper electroplating solution (content in the electroplating solution) is preferably 1 to 10000 mg/L. This is because if the content is less than 1 mg/L, the effect of preventing the dissolution of the thin copper film due to addition is small; and if the content exceeds 10000 mg/L, since the effect of preventing the dissolution of the thin copper film due to addition is saturated, the excessive addition is wasteful, and tends to have an adverse effect on filling characteristics.

Therefore, the addition quantity is preferably 1 to 10000 mg/L. The preferable range for effectively preventing the dissolution of the thin copper film is the content between 10 and 5000 mg/L.

As the copper electroplating solution, a copper sulfate electroplating solution containing copper sulfate, sulfuric acid, chlorine, and additives as major components is used. The addition of an azole or silane coupling agent according to the present invention is particularly effective for the copper sulfate electroplating solution.

The time of immersion in the electroplating solution according to the present invention is preferably 1 to 60seconds. The more preferable range of the immersion time is 3 to 10 seconds. However, this immersion time can be changed depending on the design of filling, and it is not required to limit in this time range.

In the above description, although the azole or silane coupling agent is contained in the copper electroplating solution, the dissolution of the thin copper film due to an acid can be effectively inhibited similarly when electroplating is carried out using the above-described copper sulfate electroplating solution, after immersion in a pretreatment solution consisting of an aqueous solution containing the azole or silane coupling agent.

In this case, it is preferable that the content of the azole or silane coupling agent in the pretreatment solution (in the aqueous solution) is similarly 1 to 10000 mg/L. This is because if the content is less than 1 mg/L, the effect of preventing the dissolution of the thin copper film due to addition is small; and if the content exceeds 10000 mg/L, since the effect of preventing the dissolution of the thin copper film due to addition is saturated, the excessive addition is wasteful. The more preferable content range is 10 to 5000 mg/L, similarly in the case of addition in the electroplating solution.

The time of immersion in the pretreatment solution according to the present invention is preferably 1 to 60 seconds. If it is less than 1 second, the effect is small; and if it exceeds 60 seconds, the effect is no longer changed. The more preferable range of the immersion time is 3 to 10 seconds.

The method of copper electroplating is carried out as described below, although it is not limited to a particular method. For example, a semiconductor wafer, which is a material to be electroplated, is disposed in an electroplating bath so as to face the anode. The back surface of the semiconductor wafer is sealed so as not to make contact with the electroplating solution leaving the top surface to be electroplated, and the contact for feeding electricity is disposed in the vicinity of the edge of the semiconductor wafer.

As the anode, a phosphorus-containing copper anode (P content: 0.04–0.06%), or an insoluble anode is used. As the insoluble anode, the use of Pt or Pt-electroplated Ti is preferable. A commercially available dimension stable anode (DSA) can also be used. When a phosphorus-containing copper anode is used, the copper consumed for electroplating is automatically replenished by the dissolution of the anode.

When an insoluble anode is used, since the copper content in the solution is decreased due to electroplating, a copper sulfate solution is supplied to maintain the copper content.

A typical composition of a copper electroplating solution (excluding the above-described azole or silane coupling agent) is as follows:

Copper sulfate (as copper): 0.1 to 100 g/L (preferably 10 to 50 g/L)
Sulfuric acid: 0.1 to 500 g/L (preferably 10 to 300 g/L)
Chlorine: 0.1 to 500 mg/L (preferably 30 to 100 mg/L)
Organic sulfur compound: 1 to 500 $\mu$mol/L (preferably 4 to 200 $\mu$mol/L)
Polyether compound: 0.1 to 5000 $\mu$mol/L (preferably 0.5 to 500 $\mu$mol/L)
Balance: water Furthermore, a quaternary ammonium salt addition compound consisting of a tertiary alkyl amine and polyepichlorohydrine, and polyalkylethyleneimine or the like is added within the above-described range as required.

An example of electroplating conditions is as follows:

Current density: 0.1 to 100 A/dm$^2$ (preferably 0.5 to 5 A/dm$^2$)
Solution temperature: 10 to 80° C. (preferably 15 to 30° C.)

The current density, solution temperature, and the flow rate of the solution (relative rate between the surface to be electroplated and the solution bulk) in electroplating has dependent relationship on each other, and by imparting a proper flow rate to the solution, a desired deposition rate and copper deposition (crystalline state) can be obtained.

The methods for imparting the flow rate to the solution include a method to swing or rotate the wafer to be electroplated, or a method to agitate the ambient air.

Also, as the current to be supplied in electroplating not only a direct current, but also a pulse current or PR (periodic reverse) current can be used.

When the pulse current is used, after a current flows to deposit copper for a certain time (on time), the current stops flowing for a certain time (off time), to release the copper-ion depleted state in the vicinity of the electrode, where deposition takes place, thereby enabling current density during on time to be higher than ordinary direct current.

On the other hand, when the PR current is used, copper deposited in a certain time is dissolved by supplying a reverse current for a certain time. Thereby, the deposition of copper on the portions where the current concentrates easily, such as the corner of the trench, can be inhibited. This enables the deposits that cannot be obtained by a direct current to be obtained.

The copper electroplating solution may contain an organic sulfur compound. The organic sulfur compounds include, for example, bis-sulfo disulfide disodium salt, bis-(1-sulfomethyl) disulfide disodium salt, bis-(2-sulfoethyl) disulfide disodium salt, bis-(3-sulfopropyl) disulfide disodium salt, bis-(4-sulfobutyl) disulfide disodium salt, tetramethylthiuram disulfide, tetraethylthiuram disulfide, sodium 3-mercapto-1-propanesulfonate, and sodium 2,3-dimercapto-1-propanesulfonate.

These are evenly adsorbed on the entire surface without depending on the place of the surface to be electroplated in the initial stage of electroplating, and accelerate the reaction. However, as the reaction proceeds, the adsorption density in the depressed portion in the via hole or trench elevates, resulting in the increase of the deposition rate at this portion.

In contrast, the adsorption density in the protruded portion in the vicinity of the entrance of the via hole or trench is lowered, resulting in the decrease of the deposition rate at this portion. Thus, the copper electroplating solution containing an organic sulfur compound has a significant effect to make the thickness of the deposited film even. The quantity of the organic sulfur compound is preferably 1 to 500 $\mu$mol/L.

Also, a polyether compound can be added to the copper electroplating solution. Polyether compounds that can be used include, for example, polyethyleneglycol (molecular weight: 100 to 50000) and polypropyleneglycol (molecular weight: 100 to 50000).

These are preferentially adsorbed on the surface of the wafer with a via hole or a trench (places other than the via hole or trench) at the time of electroplating, and inhibits the deposition of copper on the surface portion. The quantity of the polyether compound is preferably 0.1 to 5000 $\mu$mol/L.

Also as described above, a quaternary ammonium salt addition compound consisting of a tertiary alkyl amine and polyepichlorohydrine can be added as required. This substance effectively inhibits the deposition of copper on the surface portion of the wafer in the same manner as the polyether compound. The quantity of the quaternary ammonium salt addition compound is preferably 0.1 to 200 $\mu$mol/L.

Also, polyalkylethyleneimine can be added to the copper electroplating solution. This substance inhibits the deposition of copper on the surface portion of the wafer in the same manner as the polyether compound. The quantity of the polyalkylethyleneimine is preferably 0.1 to 7 $\mu$mol/L.

Although the above-described quaternary ammonium salt addition compound consisting of a tertiary alkyl amine and polyepichlorohydrine, and polyalkylethyleneimine are not necessarily required to be contained as the components of the electroplating solution when the content of the organic sulfur compound and the polyether compound is within the most optimal range, the effect on the filling characteristics of the fine via hole or trench is more stabilized when contained within the above-described range.

By adding the combination of the above-described additives within the above-described ranges of content of each component to the copper electroplating solution, the deposition rate of copper can be changed from place to place when copper electroplating is carried out on a semiconductor wafer with a fine via hole or trench.

That is, the deposition rate on the depressed portion in the via hole or trench can be increased, and the deposition rate on the protruded portion in the vicinity of the entrance of the via hole or trench, and on the surface of the wafer can be decreased, thereby improving the filling characteristics in the via hole or trench.

The film thickness of copper electroplating may be a thickness for filling the via hole or trench on the surface of the semiconductor wafer, and for forming wiring by planarization using subsequent chemical-mechanical polishing (CMP). In general, the thickness is 0.5 to 2 μm, but the thickness may be optionally selected without being limited to the above-described range.

EXAMPLES AND COMPARATIVE EXAMPLES

Next, the examples and the comparative examples of the present invention will be described. These examples illustrate only preferable examples, but the present invention is not limited to these examples. The present invention inevitably includes modifications and other examples within the range of the technical concept thereof.

Electroplating was carried out using electroplating solutions shown in Examples 1 to 7. Also, after immersion treatment by pretreatment solutions shown in Examples 8 and 9, electroplating was carried out using electroplating solutions.

Also electroplating was carried out using electroplating solutions shown in Comparative Examples 1 to 3. As the material to be electroplated, a silicon wafer with a fine via pattern on which TaN (30 nm)/Cu (100 nm) is sputtered was used. Electroplating of about 1 pm was carried out at a solution temperature of 20° C., and a cathode current density of 1A/dm$^2$. The via pattern had a depth of 1 μm, and a hole diameter of 0.18 μm.

Example 1

Copper 15 g/L, sulfuric acid 180 g/L, chlorine 70 mg/L, polyethyleneglycol (molecular weight: 3350) 50 μmol/L, bis-(3-sulfopropyl) disulfide disodium salt 30 μmol/L, quaternary epichlorohydrine (a quaternary ammonium salt addition compound consisting of a tertiary alkyl amine and polyepichlorohydrine) 6 μmol/L, polybenzylethyleneimine 2 μmol/L, an aqueous solution of imidazole silane (a mixed aqueous solution of 20 g/L of a silane coupling agent obtained by the equimolar reaction of imidazole and γ-glycidoxypropyltrimethoxysilane or the like, and 20 mL/L of methanol) 50 mL/L

Example 2

Copper 20 g/L, sulfuric acid 200 g/L, chlorine 50 mg/L, polyethyleneglycol (molecular weight: 10000) 10 μmol/L, sodium 3-mercapto-1-propanesulfonate 30 μmol/L, quaternary epichlorohydrine 30 μmol/L, γ-aminopropyltrimethoxysilane 2 g/L

Example 3

Copper 30 g/L, sulfuric acid 180 g/L, chlorine 100 mg/L, polyethyleneglycol (molecular weight: 15000) 10 μmol/L, bis-(2-sulfoethyl) disulfide disodium salt 20 μmol/L, quaternary epichlorohydrine 15 μmol/L, polyallylethyleneimine 1 μmol/L, γ-glycidoxypropyltriethoxysilane 500 mg/L

Example 4

Copper 10 g/L, sulfuric acid 240 g/L, chlorine 50 mg/L, polyethyleneglycol (molecular weight: 1000) 250 μmol/L, tetramethylthiuram disulfide 60 μmol/L, quaternary epichlorohydrine 45 μmol/L, N-β-(aminoethyl)-γ-aminopropyltrimethoxysilane 1 g/L

Example 5

Copper 25 g/L, sulfuric acid 200 g/L, chlorine 70 mg/L, polypropyleneglycol (molecular weight: 8000) 15 μmol/L, sodium 2,3-dimercapto-1-propanesulfonate 30 μmol/L, quaternary epichlorohydrine 25 μmol/L, polybenzylethyleneimine 2 μmol/L, γ-mercaptopropyltrimethoxysilane 2 g/L

Example 6

Copper 15 g/L, sulfuric acid 300 g/L, chlorine 50 mg/L, polypropyleneglycol (molecular weight: 20000) 2.5 μmol/L, bis-(3-sulfopropyl) disulfide disodium salt 45 μmol/L, quaternary epichlorohydrine 60 μmol/L, polyallylethyleneimine 1 μmol/L, 5-methyl-1H-benzotriazole 200 mg/L

Example 7

Copper 25 g/L, sulfuric acid 200 g/L, chlorine 60 mg/L, polyethyleneglycol (molecular weight: 5000) 40 μmol/L, bis-(2-sulfoethyl) disulfide disodium salt 15 μmol/L, quaternary epichlorohydrine 20 μmol/L, 1,2,3-benzotriazole 100 mg/L

Example 8

Pretreatment solution: An aqueous solution of imidazolesilane (a mixed aqueous solution of 20 g/l of a silane coupling agent obtained by the equimolar reaction of imidazole and γ-glycidoxypropyltrimethoxysilane or the like, and 20 mL/L of methanol) 100 mL/L (10 sec immersion)

Electroplating solution: Copper 20 g/L, sulfuric acid 300 g/L, chlorine 80 mg/L, polypropyleneglycol (molecular weight: 10000) 5 μmol/L, bis-(3-sulfopropyl) disulfide disodium salt 30 μmol/L, quaternary epichlorohydrine 25 μmol/L, polyallylethyleneimine 1 μmol/L

Example 9

Pretreatment solution: 1,2,3-benzotriazole 200 mg/L (10 sec immersion)

Electroplating solution: Copper 25 g/L, sulfuric acid 200 g/L, chlorine 100 mg/L, polyethyleneglycol (molecular weight: 5000) 30 μmol/L, bis-(2-sulfoethyl) disulfide disodium salt 15 μmol/L, quaternary epichlorohydrine 15 μmol/L

Comparative Example 1

Copper 25 g/L, sulfuric acid 150 g/L, chlorine 50 mg/L, polyethyleneglycol (molecular weight: 10000) 10 μmol/L, bis-(3-sulfopropyl) disulfide disodium salt 60 μmol/L, quaternary epichlorohydrine 15 μmol/L, polybenzylethyleneimine 2 μmol/L

Comparative Example 2

Copper 10 g/L, sulfuric acid 300 g/L, chlorine 100 mg/L, polyethyleneglycol (molecular weight: 20000) 2.5 μmol/L, sodium 3-mercapto-1-propanesulfonate 60 μmol/L, quaternary epichlorohydrine 30 μmol/L

Comparative Example 3

Copper 30 g/L, sulfuric acid 200 g/L, chlorine 80 mg/L, polyethyleneglycol (molecular weight: 5000) 30 μmol/L, tetramethylthiuram disulfide 20 μmol/L, quaternary epichlorohydrine 60 μmol/L, polyallylethyleneimine 1 μmol/L The filling characteristics of obtained deposits into fine via patterns were checked by cleavage cross-sectional SEM observation, and results as shown in Table 1 were obtained.

As Table 1 shows, no voids and seams were produced in any of Examples 1 to 9. However, voids and seams were produced in Comparative Examples 1 to 3 treated with electroplating solutions containing no azole or silane coupling agent of the present invention.

Although the representative Examples and Comparative Examples are shown above, the effect was confirmed in all the compositions according to the claims of the present invention.

TABLE 1

|  | Occurrence of voids or seams |
| --- | --- |
| Example 1 | No voids and seams |
| Example 2 | No voids and seams |
| Example 3 | No voids and seams |
| Example 4 | No voids and seams |
| Example 5 | No voids and seams |
| Example 6 | No voids and seams |
| Example 7 | No voids and seams |
| Example 8 | No voids and seams |
| Example 9 | No voids and seams |
| Comparative Example 1 | Voids and seams occurred |
| Comparative Example 2 | Voids and seams occurred |
| Comparative Example 3 | Voids and seams occurred |

The use of the copper electroplating solution and the pretreatment solution of the present invention has an excellent effect to remove the phenomenon of dissolution of a copper seed layer in sulfuric acid contained in the electroplating solution, when the formation of a copper film in the hole or on the bottom of a fine via or a trench was insufficient in the past, and to enable the copper to be filled without producing defects such as voids and seams in a fine via holes or trench formed on a semiconductor wafer.

What is claimed is:

1. A method of copper electroplating a material, comprising the step of electroplating the material in a copper sulfate electroplating solution containing a silane coupling agent, and, as major components, copper sulfate, sulfuric acid, chlorine, and additives for 1 to 60 seconds.

2. The method according to claim 1, wherein said step of immersing the material in said electroplating solution is for 3 to 10 seconds.

3. A method according to claim 2, wherein said electroplating solution contains 1 to 10,000 mg/L of said coupling agent.

4. A method according to claim 3, wherein said electroplating solution contains 10 to 5,000 mg/L of said coupling agent.

5. A method according to claim 1, wherein said electroplating solution contains 1 to 10,000 mg/L of said coupling agent.

6. A method according to claim 5, wherein said electroplating solution contains 10 to 5,000 mg/L of said coupling agent.

7. A method according to claim 1, wherein the material is a semiconductor wafer.

8. A method of copper electroplating a material, comprising the steps of electroplating the material in a copper sulfate electroplating solution containing copper sulfate, sulfuric acid, chlorine, and additives as major components, and before said electroplating step, immersing the material in an aqueous solution containing a silane coupling agent.

9. The method according to claim 8, wherein said step of immersing the material in said aqueous solution is for 1 to 60 seconds.

10. A method according to claim 9, wherein said aqueous solution contains 1 to 10,000 mg/L of said coupling agent.

11. A method according to claim 10, wherein said aqueous solution contains 10 to 5,000 mg/L of said coupling agent.

12. The method according to claim 8, wherein said step of immersing the material in said aqueous solution is for 3 to 10 seconds.

13. A method according to claim 12, wherein said aqueous solution contains 1 to 10,000 mg/L of said coupling agent.

14. A method according to claim 13, wherein said aqueous solution contains 10 to 5,000 mg/L of said coupling agent.

15. A method according to claim 8, wherein said aqueous solution contains 1 to 10,000 mg/L of said coupling agent.

16. A method according to claim 15, wherein said aqueous solution contains 10 to 5,000 mg/L of said coupling agent.

17. A method according to claim 8, wherein the material is a semiconductor wafer.

\* \* \* \* \*

UNITED STATES PATENT AND TRADEMARK OFFICE
CERTIFICATE OF CORRECTION

PATENT NO.    : 6,562,222 B1
DATED         : May 13, 2003
INVENTOR(S)   : Sekiguchi et al.

It is certified that error appears in the above-identified patent and that said Letters Patent is hereby corrected as shown below:

Title page,
Item [22], PCT Filed, "Jun. 26, 2000" should read -- May 26, 2000 --
Item [57], ABSTRACT,
Line 4, "solution. containing" should read -- solution containing --

Column 8,
Line 21, "imidazolesilane" should read -- imidazole --
Line 23, "Imidazole" should read -- imidazolesilane --

Signed and Sealed this

Twenty-eighth Day of October, 2003

JAMES E. ROGAN
*Director of the United States Patent and Trademark Office*